United States Patent [19]
McKenny et al.

[11] Patent Number: 5,708,601
[45] Date of Patent: Jan. 13, 1998

[54] INTEGRATED CIRCUITRY FOR CHECKING THE UTILIZATION RATE OF REDUNDANCY MEMORY ELEMENTS IN A SEMICONDUCTOR MEMORY DEVICE

[75] Inventors: Vernon G. McKenny, Cuchara, Colo.; Luigi Pascucci, Sesto San Giovanni; Marco Maccarrone, Palestro, both of Italy

[73] Assignee: SGS-Thomson Microelectronics S.r.l., Agrate Brianza, Italy

[21] Appl. No.: 602,237

[22] Filed: Feb. 16, 1996

Related U.S. Application Data

[63] Continuation-in-part of Ser. No. 350,961, Dec. 7, 1994, Pat. No. 5,493,531.

[30] Foreign Application Priority Data

Dec. 9, 1993 [EP] European Pat. Off. ............ 93830493

[51] Int. Cl.⁶ .................................................. G11C 7/00
[52] U.S. Cl. ...................... 365/185.09; 365/200; 365/201
[58] Field of Search .............................. 365/200, 201, 365/185.09; 371/10.2

[56] References Cited

U.S. PATENT DOCUMENTS 4,586,170  4/1986  O'Toole et al. ................. 365/200
5,124,949  6/1992  Morigami ......................... 365/210
5,493,531  2/1996  Pascucci et al. ................. 365/200

FOREIGN PATENT DOCUMENTS 42 26 070   6/1993   Germany.
WO 82/02793 8/1992   WIPO.

Primary Examiner—Joseph A. Popek
Attorney, Agent, or Firm—David V. Carlson; Bryan A. Santarelli; Seed and Berry LLP

[57] ABSTRACT

An apparatus identifies redundancy memory cells that are selected to replace defective memory cells of a memory matrix that communicates with a data bus. A redundancy address register is associated with one of the redundancy memory cells. The redundancy address register stores a default state until it is programmed with an address of one of the defective memory cells. A control circuit generates a test signal during an identification mode. A detect circuit is coupled to the control circuit and to the redundancy address register and generates a default-detect signal in response to the test signal when the redundancy address register contains the default state. A data-bus multiplexer that is coupled to the redundancy-cell selection circuit, the data bus, and the control circuit couples the default detect signal to the data bus in response to the test signal.

35 Claims, 5 Drawing Sheets

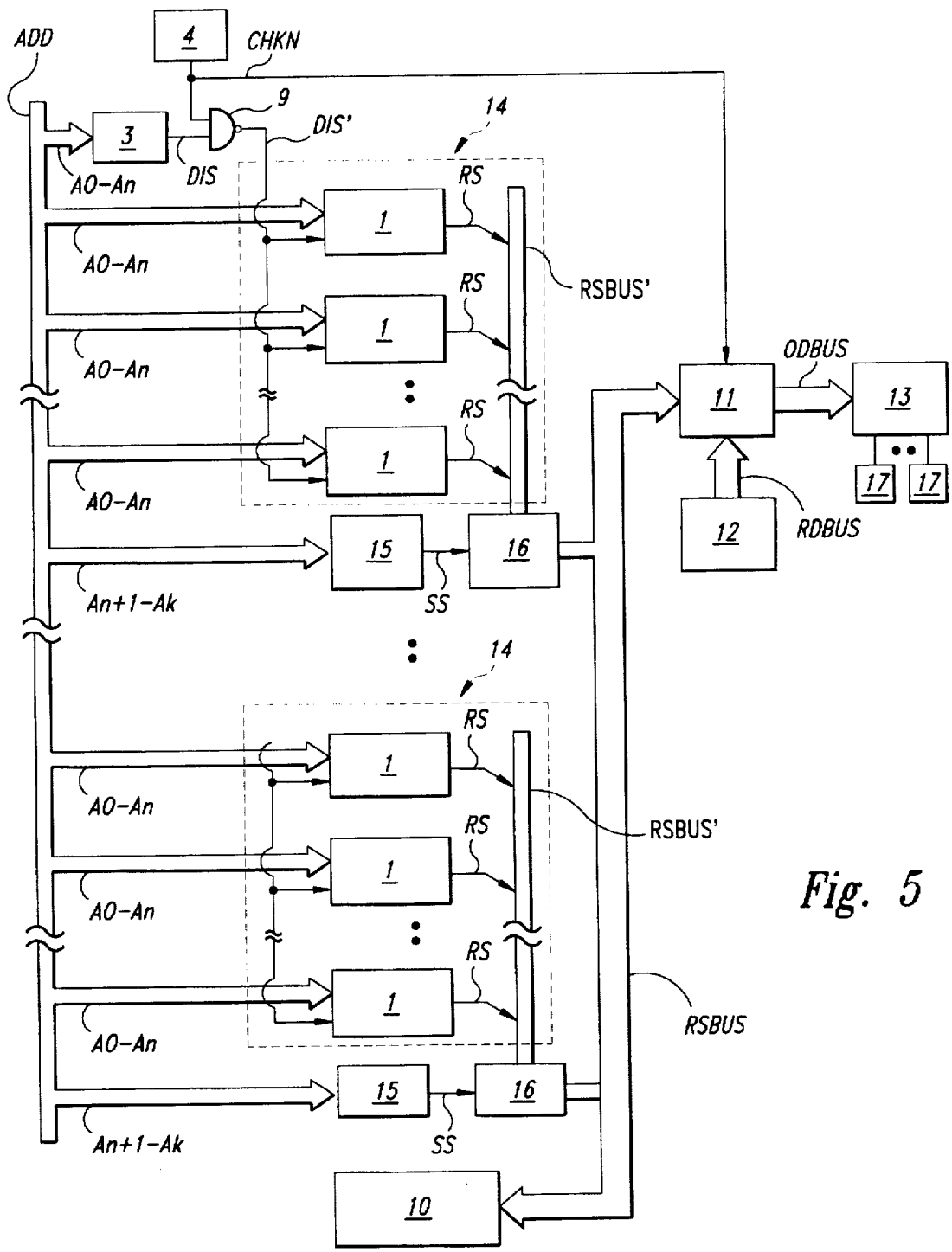

INTEGRATED CIRCUITRY FOR CHECKING THE UTILIZATION RATE OF REDUNDANCY MEMORY ELEMENTS IN A SEMICONDUCTOR MEMORY DEVICE

CROSS-REFERENCE TO PRIOR APPLICATION

This application is a continuation-in-part of U.S. patent application Ser. No. 08/350,961, filed Dec. 7, 1994, now U.S. Pat. No. 5,493,531.

TECHNICAL FIELD

The present invention relates to an integrated circuitry for checking the utilization rate of redundancy memory elements in a semiconductor memory device.

BACKGROUND OF THE INVENTION

In the manufacture of semiconductor memories defects are frequently encountered that afflict a limited number of memory elements in a memory matrix. The reason for the high probability of defects of this type resides in that in a semiconductor memory device the greatest part of the chip area is occupied by the memory matrix; moreover, it is in the memory matrix, and not in the peripheral circuitry, that the manufacturing process characteristics are usually pushed to limits.

In order to avoid that the presence of a limited number of defective matrix memory elements on many millions forces the rejection of the entire chip, and therefore to increase the manufacturing process yield, the technique is known of providing for the manufacture of a certain number of additional memory elements, commonly called "redundancy memory elements," to be used as a replacement of those matrix memory elements that, during testing of the memory device, prove defective; the selection circuits, with which the integrated component must necessarily be provided, and which allow the above-mentioned functional replacement of a defective matrix memory element with a redundancy memory element are indicated as a whole with the name of "redundancy circuitry," while the set of redundancy memory elements and circuitry is defined for short as "redundancy."

The redundancy circuitry comprises programmable nonvolatile memory registers suitable to store those address configurations corresponding to the defective matrix memory elements; such registers are programmed once and for all during the memory device testing, and must retain the information stored therein even in absence of the power supply.

Each nonvolatile memory register must therefore be made up of a number of programmable memory cells at least equal to the number of address bits which allows the selection of the matrix memory elements. Each memory cell of a memory register is therefore dedicated to store the logical state of a particular address bit of the address configuration corresponding to a defective matrix memory element, and comprises at least one programmable nonvolatile memory element, a circuit for programming the memory element, a circuit for reading the information stored in the memory element and a circuit for comparing said information with the current logical state of the address bit associated to the memory cell.

Since, however, even unprogrammed nonvolatile memory registers, associated with unused redundancy memory elements often store a particular address configuration, i.e., they store that particular address configuration corresponding to the unprogrammed condition of the memory cells, when a non-defective matrix memory element is addressed whose address coincides with the logical configuration of the memory cells in an unprogrammed memory register, the redundancy memory element associated with said unprogrammed register will be selected instead of the non-defective matrix memory element. If in a memory device two or more redundancy memory elements are not used, since the unprogrammed condition is often the same for all the memory cells of the nonvolatile memory registers, addressing the non-defective matrix memory element whose address coincides with the configuration of the unprogrammed memory cells-would cause said two or more redundancy memory elements to be selected simultaneously.

To prevent such unacceptable simultaneous selection, each nonvolatile memory register is provided with an additional programmable memory cell (called "guard memory cell" or "control memory cell") which allows the selection of the associated redundancy memory element only in the case it is programmed. This however causes a significant increase in the overall chip area.

Furthermore, in order to evaluate the degree of defectiveness of the manufacturing process, or of a given fabrication lot of memory device chips, it is useful to know for each chip how many redundancy memory elements have been utilized to replace defective matrix memory elements, in other words to perform a "resources check."

According to a known technique, this can be done by putting the memory device in a particular test mode in which all the selection signals for the redundancy memory elements generated by the nonvolatile memory registers are ORed together and the resulting signal is supplied to one output buffer driving an output pad of the memory device; the memory device is then sequentially supplied with all the possible address configurations; each time an address configuration corresponding to a defective matrix memory element which has been replaced by a redundancy memory element is supplied to the memory device, the corresponding nonvolatile register will activate the selection signal for the redundancy memory element, and this occurrence will be detected by the testing machine by sensing the logical state of said output pad. A given nonvolatile memory register will activate the corresponding selection signal only if the current address configuration supplied to the memory device coincides with that stored in it, and if the respective guard memory cell is programmed.

This is a lengthy procedure, especially for dense memory devices, wherein the possible address configurations can be several millions; furthermore, the testing machine must keep track of the number of times the output pad changes its logical state.

In the copending European Patent Application No. 93830491.2 in the name of the same Applicant, a redundancy circuitry is described wherein no guard memory cells are required in the nonvolatile memory registers; this is achieved by means of the generation of an inhibition signal which inhibits the activation of the selection signals for the redundancy memory elements each time the memory device is supplied with an address configuration coincident with the logical state stored in a nonprogrammed nonvolatile memory register.

SUMMARY OF THE INVENTION

An object of the present invention is to realize an integrated circuit that takes less time to check the utilization rate of redundancy memory elements in a semiconductor device, such as a memory device.

According to one aspect of the present invention, this object may be achieved by an apparatus for identifying redundancy memory cells that are selected to replace defective memory cells of a memory matrix, which communicates with a data bus. The apparatus includes a redundancy address register that is associated with one of the redundancy memory cells. The redundancy address register stores a default state until it is programmed with an address of one of the defective memory cells. A control circuit generates a test signal during an identification mode. A detect circuit is coupled to the control circuit and to the redundancy address register. The detect circuit generates a default-detect signal in response to the test signal when the redundancy address register contains the default state. A data-bus multiplexer is coupled to the detect circuit, data bus, and control circuit. The, data-bus multiplexer couples the default-detect signal to the data bus in response to the test signal.

Another object Of the present invention is to realize an integrated circuit that takes less time to check the utilization rate of redundancy memory elements in a semiconductor device, such as a memory device, where the integrated circuit is suitable for use in conjunction with redundancy circuitry that includes guard storage cells that are associated with the nonvolatile redundant address registers.

According to another aspect of the present invention, this object may be achieved by an apparatus for identifying redundancy memory cells that are programmed to replace defective memory cells of a memory matrix that communicates with a data bus and an address bus. The apparatus includes a control circuit that generates during a redundancy-check mode a redundancy-check signal having a first state. A redundancy address register is associated with one of the redundancy memory cells and a guard storage portion that stores an unprogrammed state until the redundancy address register is programmed with an address of one of the defective memory cells. A data-bus multiplexer is coupled to the redundancy address register, the data bus, and the control circuit, and couples the guard portion to the data bus in response to the first state of the redundancy-check signal. Thus, by reading the data bus, one can obtain the number of unprogrammed redundancy memory cells. Using this number and the total number of redundancy memory cells, one can also calculate the number of programmed redundancy memory cells.

BRIEF DESCRIPTION OF THE DRAWINGS

The features of the present invention will be made more evident by the following detailed description of various aspects thereof, illustrated as non-limiting examples in the annexed drawings, wherein:

FIG. 4 is a schematic diagram of the combinational circuit of FIG. 1;

FIG. 5 is an electrical schematic diagram of a part of a semiconductor memory device with an integrated circuitry according to a second embodiment of the invention;

DETAILED DESCRIPTION OF THE INVENTION

Figure 1:
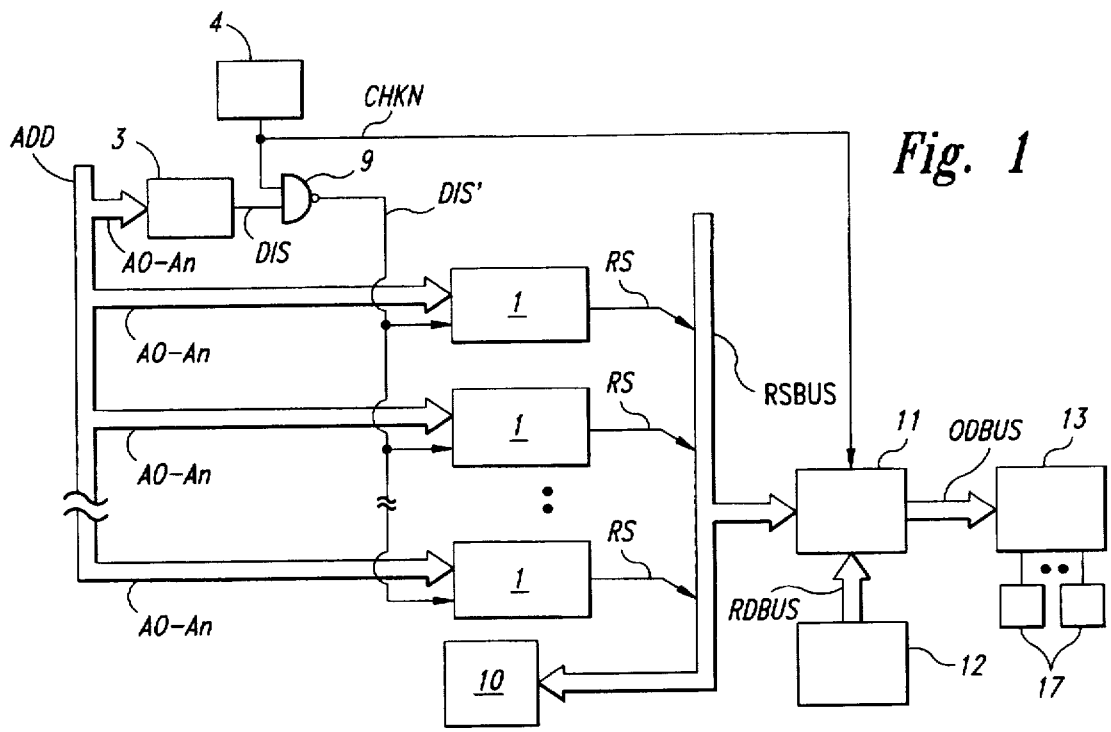
FIG. 1 is an electrical schematic diagram of a part of a semiconductor memory device with an integrated circuitry according to a first embodiment of the present invention.

As shown in FIG. 1, a Semiconductor memory device according to a first embodiment of the present invention comprises a redundancy circuitry which is integrated in a memory device chip and comprises a plurality of redundancy address locations, i.e., nonvolatile memory registers 1, each associated with a respective redundancy memory element (not shown).

In practical implementations of redundancy, providing for the existence of rows ("word lines") or columns ("bit lines") or both rows and columns of redundancy memory elements, each nonvolatile memory register 1 has associated with it a respective redundancy row or column. The details of the redundancy cells themselves are not of concern to the present invention, and in the following description it will be assumed that each nonvolatile memory register 1 has associated with it one or more redundancy memory elements.

As also shown in FIG. 1, each nonvolatile memory register 1 is supplied with address signals A0-An, taken from an address signals bus ADD; the address signals bus ADD also supplies decoding circuits (not shown) for the selection of a particular memory element in the memory matrix.

Figure 2:
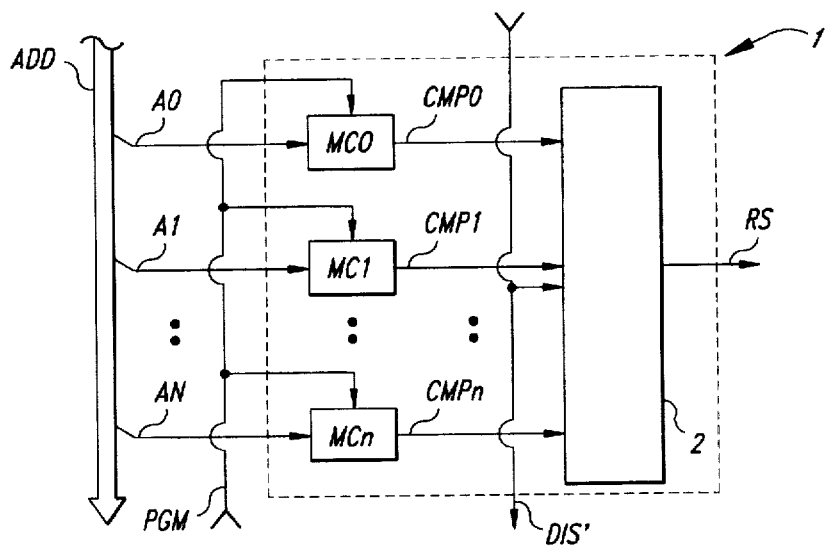
FIG. 2 is an electrical schematic diagram of a nonvolatile memory register for a redundancy circuitry of the semiconductor memory device of FIG. 1.
Figure 3:
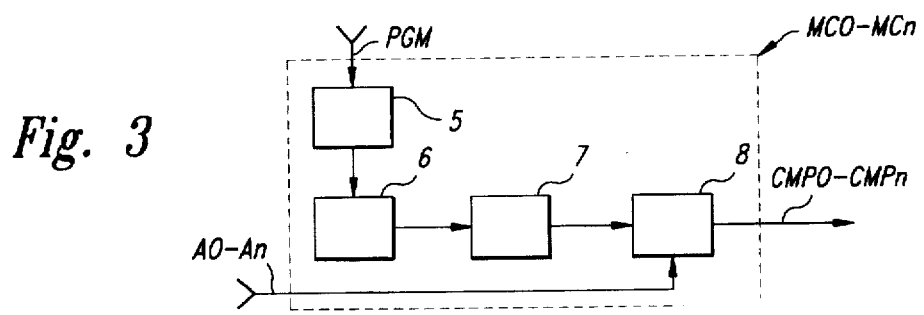
FIG. 3 is a schematic block diagram of a memory cell of the nonvolatile memory register of FIG. 2.

As shown in FIG. 2, each nonvolatile memory register 1 comprises a plurality of programmable nonvolatile memory cells MC0-MCn; each of said cells MC0-MCn is supplied with one of the address signals A0-An and comprises in a per-se known way, as shown in FIG. 3, at least one programmable nonvolatile memory element 6, a first circuit 5 for programming said memory element 6, a second circuit 7 for reading the information stored in the nonvolatile memory element 6 and a third circuit 8 for comparing said information with the current logical state of the respective address signal A0-An. All the memory cells MC0-MCn of a given nonvolatile memory register 1 are also supplied with a signal PGM (not shown in FIG. 1) supplied by a control circuitry 4 of the memory device to enable the programming of the memory element 6; different nonvolatile memory registers 1 are supplied with different signals PGM, so that one register 1 is programmable at a time. The control circuit 4 is a logic control circuit of any suitable type, many being well known in the art. The circuit 4 includes those circuits generally provided on a memory to control their operating modes. In the simplest case, the control circuit 4 is comprised of logic gates which, according to voltage levels present on certain external pins or input signal lines, enable various modes of the memory, such as the programming mode, the read mode, a factory specified test mode, or the like. The exact structure and specific functions of the circuit 4 will vary from chip to chip and can be quite complex. However, such control circuitry is part of memory chips today and those with skill in the art will be able to select or design such a circuit for each memory chip using known circuits and general background knowledge based on the use of circuit 4 as described herein.

Each memory cell MC0-MCn has an output signal CMP0-CMPn which is activated whenever the current logical state of the respective address signal A0-An coincides with the logical state stored in the nonvolatile memory element 6 of the cell MC0-MCn.

Each nonvolatile memory register 1 further comprises a redundancy memory element or redundancy-cell selection circuit 2, which is supplied with all the signals CMP0-CMPn and generates a signal RS used to select one redundancy memory element and to deselect a defective matrix memory element whose address coincides with the address configuration stored in the nonvolatile register 1.

The redundancy circuitry also comprises a combinatorial circuit 3 supplied with the address signals A0-An and generating a signal DIS which forms one input of a NAND gate 9; a second input of the NAND gate 9 is supplied with a signal CHKN which is generated by the control circuitry 4. An output signal DIS' of the NAND gate 9 is individually supplied to all the redundancy memory element selection circuits 2 of the nonvolatile memory registers 1.

FIG. 4 shows one example of combinatorial circuit 3, which generates signal DIS when address bus A0-An carries the selected address corresponding to that stored in the unprogrammed nonvolatile registers 1. Circuit 3 includes an n-input NOR gate 20, which generates a high logic state at its output when a low logic state is simultaneously present on all its inputs. Some or all of the inputs may include inverters, which may either be integral with NOR gate 20 or external thereto. The pattern of inverters determines which of the selected address, which when present on the address bus will cause NOR gate 20 to generate at its output a high logic state, i.e., activate DIS. In the example shown in FIG. 4, no inverters are used; thus, address 0 is the selected address stored in the unprogrammed registers 1. Although shown as a NOR gate, combinatorial circuit 3 may be formed from other circuits without departing from the spirit and scope of the invention.

Referring again to FIG. 1, control circuit 4 generates CHKN according to voltage signals present on external mode pins of the memory chip. Modes controlled by these external mode pins may include programming and various factory and field test modes. As discussed above, control circuits that can be used for control circuit 4 are known in the art.

All the output signals RS of the nonvolatile memory registers 1 are grouped together to form a redundancy selection signals bus RSBUS; this bus is normally provided in the memory device, wherein it runs from the nonvolatile registers 1 to the memory matrix 10 wherein the redundancy memory elements are physically obtained.

The redundancy selection signals bus RSBUS also supplies a first input channel of a multiplexing circuit 11; a second input channel of the multiplexing circuit 11 is supplied with a read data bus RDBUS in which all the signals generated by a per-se known sensing circuitry 12 are grouped together; the sensing circuitry 12 is used to read the information stored in the addressed memory elements when the memory device is operated in reading condition. An output channel of the multiplexing circuit 11 is connected to an output data bus ODBUS which supplies a buffer circuitry 13; each signal in the ODBUS supplies a respective output buffer in the buffer circuitry 13; each output buffer drives a respective output pad 17 of the memory device. The signal CHKN also constitutes a control signal for the multiplexing circuit 11: when CHKN is activated, the output channel of the multiplexing circuit 11 is connected to the first input channel, so that the selection signal bus RSBUS is transmitted to the buffer circuitry 13; when instead CHKN is not activated, the output channel of the multiplexing circuit 11 is connected to the second input channel, so that the read data bus RDBUS is transmitted to the buffer circuitry.

At the end of the manufacturing process of the memory device, all the programmable nonvolatile memory elements 6 included in the memory cells MC0-MCn of all the nonvolatile memory registers 1 are in a well-known and defined logical state, i.e., in the virgin or non-programmed state.

During the memory device testing, the address configurations corresponding to defective matrix memory elements are programmed into respective nonvolatile memory registers 1; in some embodiments, the testing machine keeps track of all the defective matrix memory elements, and then programs the registers 1 after the whole matrix has been tested. Each time a defective matrix memory element is encountered, the testing machine puts the memory device in a condition such that the control circuitry 4 activates one signal PGM, to enable the programming of the memory cells MC0-MCn of a given nonvolatile memory register 1; in this way any successive attempt to address said defective matrix memory element will automatically cause a redundancy memory element to be addressed. At the end of this phase, it is possible that some redundancy memory elements are left unused, and the associated nonvolatile memory registers 1 are therefore left in their unprogrammed state.

When the memory is operated in normal reading condition, the control circuitry 4 keeps the signal CHKN in the high logical level; in such condition, the logical state of the signal DIS' at the output of the NAND gate 9 depends on the logical state of the signal DIS, as will be explained later on; the output channel of the multiplexing circuit 11 is connected to the second input channel, i.e., the output data bus ODBUS is connected to the read data bus RDBUS, so that the data stored in the addressed matrix memory elements, read by the sensing circuitry 12, are transferred to the buffer circuitry 13 and then to respective output pads 17. If a defective matrix memory element is addressed, the nonvolatile register 1 wherein its address has been programmed during testing recognizes such address and activates the signal RS, to deselect the defective matrix memory element and simultaneously to select a redundancy memory element. If the current address configuration supplied to the memory device coincides with the address stored in a non-programmed nonvolatile memory register, the combinatorial circuitry 3 recognizes the event and activates the signal DIS; this in turn causes the signal DIS' to be activated, so that the activation of all the signals RS is inhibited. This prevents, if two or more non-programmed nonvolatile memory registers 1 are present in the memory device, the associated redundancy memory elements from being simultaneously selected.

If it is desired to perform a "resources check" for the memory device, this must be put in the testing environment; the testing machine puts the memory device in a particular test mode in which the control circuitry 4 drives the signal CHKN to the low logical state; this causes the signal DIS' to go to the high logical state, independently of the state of the signal DIS, and also causes the output channel of the multiplexing circuit 11 to be connected to the redundancy selection signals bus RSBUS. The memory device is then supplied with an address configuration A0-An coincident with the logical state stored in non-programmed nonvolatile registers 1. Even if such address configuration is recognized by the combinatorial circuitry 3, the activation of the signal DIS' is inhibited; all the non-programmed nonvolatile registers 1, associated to unused redundancy memory elements, will therefore activate the respective signal RS; the programmed nonvolatile registers 1, associated to redundancy memory elements which have been utilized to replace defective matrix memory elements, will instead not activate the respective signals RS. The number of activated signals in the RSBUS will therefore correspond to the number of unused redundancy memory elements. Since the activation of the CHKN signal has caused the output channel of the multiplexing circuit 11 to be connected to the RSBUS, this will be transmitted to the buffer circuitry 13, and hence to the output pads 17. Each signal in the RSBUS is thus associated to a respective output pad 17, and it is therefore possible for the testing machine, by sensing the logical state of the output pads 17, to know which and how many unused redundancy memory elements are present in the memory device.

In the described embodiment, the number of signals in the ODBUS must be at least equal to the number of signals in the RSBUS, i.e., to the number of redundancy memory elements. It is however possible, with minor modifications, to utilize the structure according to the invention even in the case the number of redundancy memory elements is greater than the number of signals available in the ODBUS of the memory device; this can be done for example by splitting the RSBUS into two distinct buses, and using a multiplexing circuit with three input channels; for the selection of which of the input channels must be connected to the output channel (i.e., to the ODBUS), the control circuitry 4 must in this case supply the multiplexing circuit with two distinct signals, instead of the single signal CHKN. To carry out the "resources check" operation, the signals of the two redundancy selection signals buses are sequentially supplied to the buffer circuitry 13.

In FIG. 5 a second embodiment of the invention is shown, suitable for a memory device in which the memory matrix is divided in sectors individually addressable; such architecture is used for example in Flash EEPROM devices. Each sector is provided with redundancy memory elements; to increase the reparability rate, and thus the process yield, defective matrix memory elements in a given sector can be replaced with a redundancy memory element without causing non-defective matrix memory elements of other sectors having identical addresses to be simultaneously replaced with the redundancy memory element. This is obtained by providing each sector with a respective set 14 of nonvolatile memory registers, and by submitting the selection of a redundancy memory element to a sector address decoding.

As shown in FIG. 5, each set 14 comprises an equal number of nonvolatile memory registers 1, supplied with address signals A0-An which also supplies a decoding circuitry (not shown) for the selection of a particular matrix memory element in each sector. All the output signals RS of the nonvolatile registers 1 of a given set are grouped together to form a local redundancy selection signals bus RSBUS, which is supplied to an input channel of a multiple switch 16; the output channel of the multiple switch 16 is connected to the redundancy selection signals bus RSBUS, already encountered in the description of the previous embodiment. Each multiple switch 16 is controlled by a signal SS supplied by a sector address decoding and selection circuit 15 which is supplied by sector address signals An+1-Ak taken from the address signals bus ADD.

During a "resources check," the control circuitry 4 drives the signal CHKN to the low logical state, and the activation of the signal DIS' is therefore disabled; the multiplexing circuit 11 connects the RSBUS to the ODBUS, and thus to the buffer circuitry 13.

The memory device is then supplied with an address configuration wherein the address signals A0-An are in a logical state coincident with the logical state stored in non-programmed nonvolatile registers 1; all the non-programmed nonvolatile registers 1 in all the sets 14 will therefore activate their output signals RS; the sector address signals An+1-Ak are sequentially changed to address one different sector at a time, so that only one RSBUS' is connected, via the respective multiple switch 16, to the RSBUS. By sensing the logical state of the output pads 17, it is thus possible to know which and how many redundancy memory elements in each sector have not been utilized to replace defective matrix memory elements.

Referring again to FIGS. 1–5, although the unprogrammed state of the nonvolatile memory registers 1 is described as being a default address, other unprogrammed values may be used to indicate that the associated redundancy memory cell has not been selected or programmed to replace a defective matrix memory cell. In such embodiments, the nonvolatile memory registers 1 may be polled in a way other than supplying them with a default address.

Figure 6:
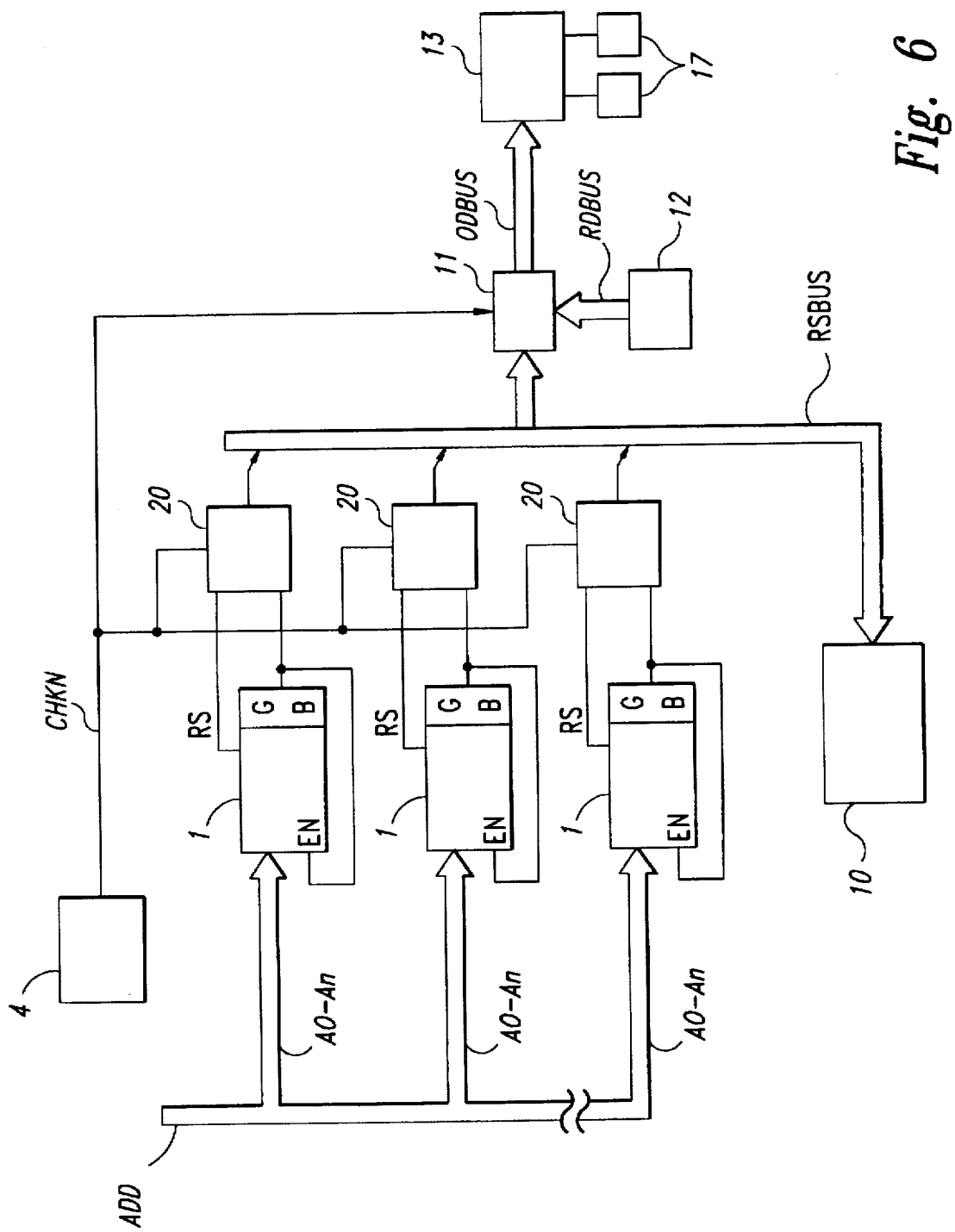
FIG. 6 is a schematic block diagram of a portion of a semiconductor memory device according to a second embodiment of the present invention.

FIG. 6 is a schematic diagram of a circuit that is similar to the circuit shown in FIG. 1. Therefore, like numerals are used to refer to like components of the circuit.

One difference between the circuits of FIGS. 1 and 6 is that the redundancy address registers 1 in FIG. 6 include or have associated therewith guard storage sections, portions, registers, or cells, here shown as a guard bit GB. When a register 1 is programmed with the address of a defective memory cell, its guard bit GB is programmed, and thus has a programmed state or value. When the register 1 is not programmed with the address of a defective matrix memory cell, then its guard bit GB is not programmed, and thus has an unprogrammed state or value. Each of the guard bits GB is coupled to an enable input EN of its register 1. In one embodiment of the invention, EN is coupled to an input of the redundancy-cell selection circuit 2 (FIG. 2). Thus, when the guard bit GB has a programmed state, it enables the redundancy-cell selection circuit 2 associated with its register 1 to generate a redundancy select signal RS when the address on the address bus ADD equals the programmed address that is stored in the register 1. If the guard bit GB is in an unprogrammed state, then the redundancy-cell selection circuit 2 cannot generate a redundancy select signal RS.

Both the guard bit GB associated with and the redundancy select line from a register 1 are respectively coupled to a pair of inputs of a multiplexer circuit 20. A control input of the circuit 20 is coupled to the signal CHKN, and the output of the circuit 20 is coupled to a line of the redundancy select bus RSBUS. Thus, during a check mode, when the signal CHKN is at a logic low, the multiplexer circuit 20 couples the guard bit GB to the RS bus, which the multiplexer 11 couples to the data bus. Thus, each output pad 17 can be probed to determine the state of each guard bit GB, and thus to identify the redundancy address registers 1 that have not been programmed with the address of a defective memory cell. During an operational mode, when the CHKN signal is a logic high, the multiplex circuit 20 couples the redundancy select signal from the register 1 to the RS bus in order to activate a corresponding redundancy memory cell in the matrix 10 as discussed above. During the operational mode, the multiplexer 11 couples the bus RDBUS to the data bus, and thus allows normal reading from and writing to the memory device.

There are alternative embodiments to the circuit of FIG. 6. For example, there may be two buses, i.e., a first bus that carries or couples the guard bits GB to the multiplexer 11, and a second bus, which may be the RSBUS, that couples the selection signal RS from the registers 1 to the redundant memory cells. Thus, with two buses, the multiplexer circuit 20 could be eliminated, with the guard bits GB coupled directly to the first bus and the selection signals RS coupled directly to the second or RSBUS. In another embodiment of the invention, the signal CHKN may be coupled to the registers 1 to disable the selection circuits 2 (FIG. 2) during the check mode, and thus prevent the generation of the RS signals during the check mode.

Figure 7:
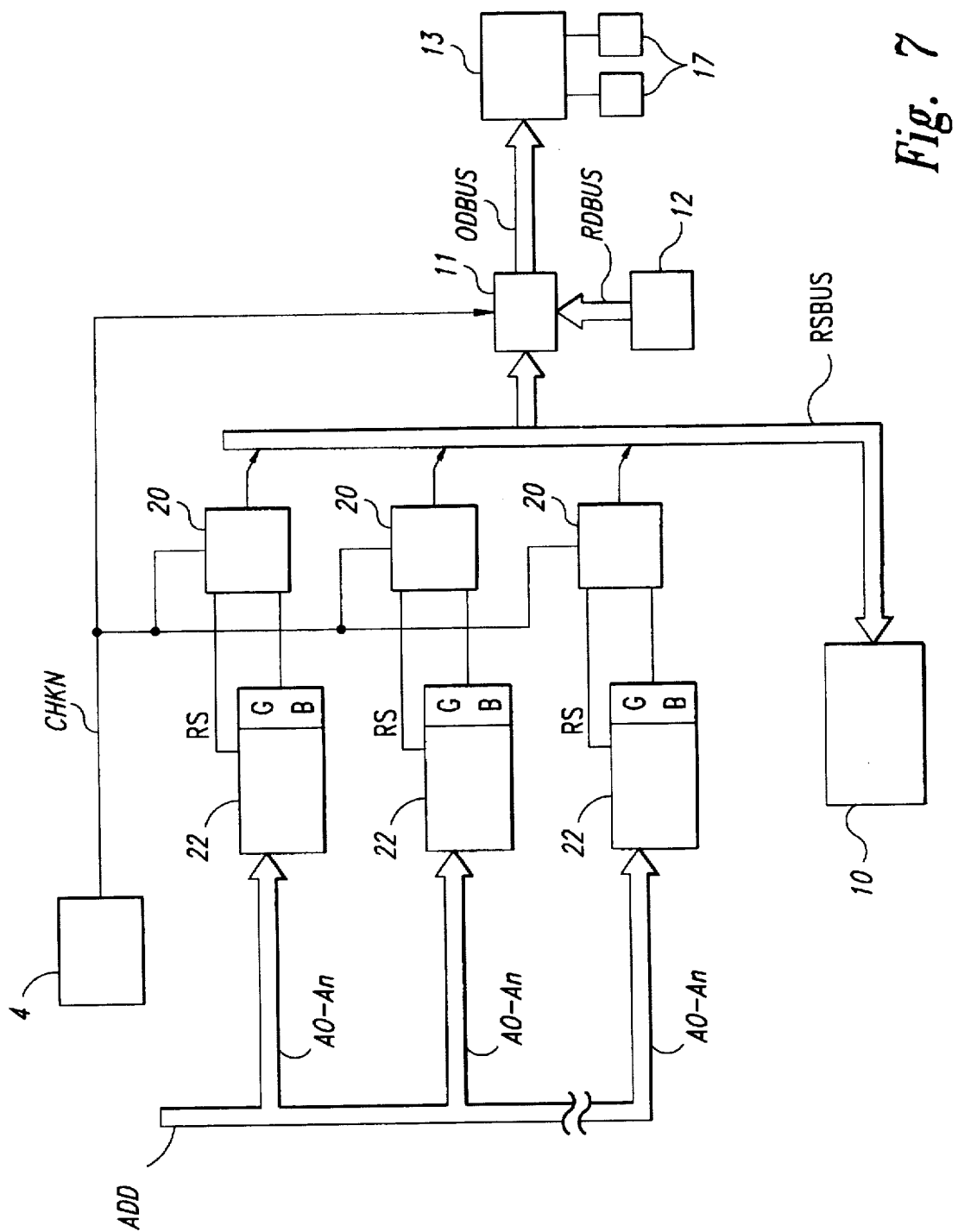
FIG. 7 is a schematic block diagram of a portion of a semiconductor memory device according to a third embodiment of the present invention.

FIG. 7 is a schematic block diagram of a circuit that is similar to that shown in FIG. 6. Therefore, like numerals are used to refer to like components of the circuit. A difference between the circuits of FIGS. 6 and 7 is that the circuit of FIG. 7 includes nonvolatile-register/redundancy-cell-select circuits 22, which are each associated with, but not coupled to, a guard bit GB.

In operation, if a circuit 22 is programmed with the address of a defective memory cell and that address occupies the address bus, the circuit 22 generates a signal RS, which the redundancy multiplexer 20 couples to the appropriate redundant memory cell or cells via the RS bus. If it is unprogrammed, then the circuit 22 never generates the signal RS.

If the circuit 22 is programmed with the address of a defective memory cell, the guard bit GB is also programmed. Likewise, if the circuit 22 is unprogrammed, then the guard bit GB is also unprogrammed. During a check mode when the signal CHKN is active, the redundancy multiplexer 20 couples the contents of, i.e., the GB signal generated by, the guard bit GB to the data bus ODBUS via the RS bus and the multiplexer 11. In all other aspects, the circuit shown in FIG. 7 operates similarly to that shown in FIG. 6, and thus provides on the data bus ODBUS the contents of the guard bits GB, which allow one to easily and quickly calculate the number of redundant memory cells that the memory device has mapped to replace defective matrix memory cells.

One advantage provided by the circuits shown in FIGS. 6 and 7 is that there is no default address that is reserved as an unprogrammed state. Thus, ability to repair the memory cell at address 00 is not reduced.

Figure 8A:
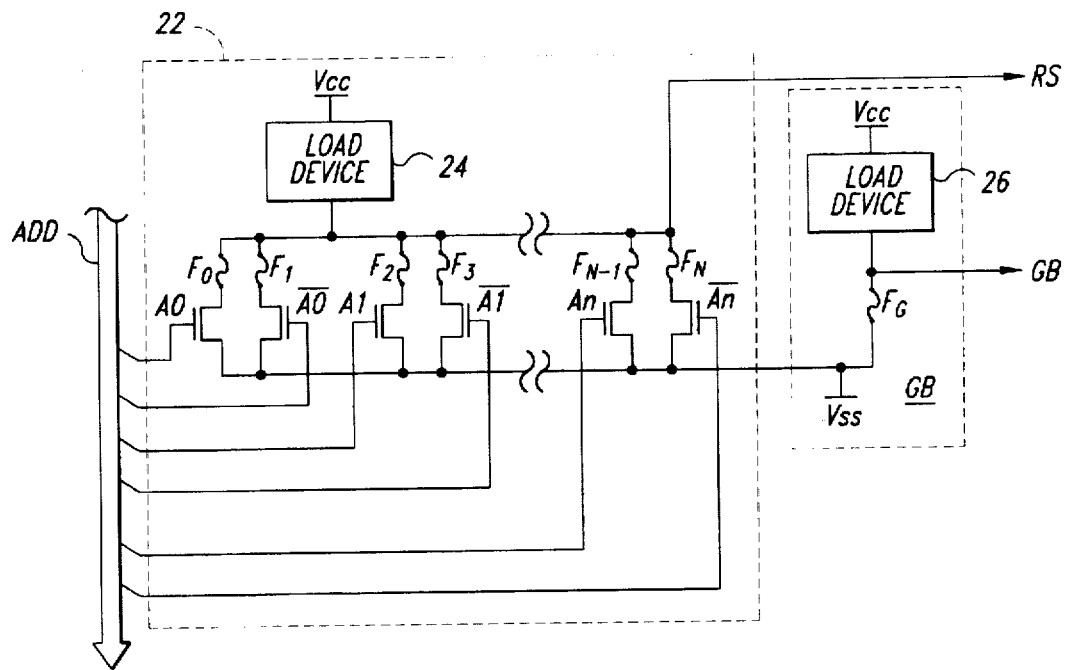
FIG. 8A is a schematic diagram of first embodiments of a nonvolatile-register/redundancy-cell-select circuit and a guard bit of FIG. 7.

FIG. 8A is a schematic diagram of one embodiment of the nonvolatile-register/redundancy-cell-select circuits 22 and the guard bit GB of FIG. 7. A conventional load device 24, such as a resistor or an MOS transistor, has a first terminal coupled to a power-supply voltage Vcc and has a second terminal that provides the signal RS. Multiple programmable conduction elements, here fuses F0-Fn, each have a first terminal coupled to the second terminal of the load device, and have a second terminal. A number of switches (here MOS-type transistors), which are arranged in parallel-coupled pairs, have their switchable paths coupled between a reference voltage Vss and the second terminal of one of the fuse elements F. Each pair of switches is associated with one bit of the address signal. The control terminal of one of the switches in a pair is coupled to receive the associated address bit, and the control terminal of the other switch of the pair is coupled to receive the complement of the associated address bit. For example, as shown for a first pair of transistors, the first transistor has its gate coupled to the address bit A0 and has its drain and source coupled between Vss and the fuse element F0. The second transistor of the pair has its gate coupled to $\overline{A0}$ and its drain and source coupled between Vss and the fuse element F1. Although described as MOS-type transistors, the switches may be conventional bipolar transistors or another type of conventional switching circuit.

The GB circuit includes a conventional load device 26, which has a first terminal coupled to Vcc and has a second terminal. A programmable conduction element, here a fuse element FG, is coupled between the second terminal of the load device 26 and Vss. The GB circuit provides its contents, i.e., the signal GB, at the second terminal of the load device 26.

In operation, when the circuit 22 is unprogrammed, all of the fuses F0-FN remain closed, i.e., conductive or unblown. Thus, no matter what address value is on the address bus, at least one of the transistors will be active and pull the RS signal to an inactive logic 0. Furthermore, the fuse FG also remains unblown. Thus, the GB circuit generates for the signal GB an inactive logic 0.

When the circuit 22 is programmed with an address of a defective memory cell, one fuse F from each transistor pair is blown such that when the programmed address occupies the address bus, all the transistors that are coupled to unblown fuses are inactive. Because there is no conductive path from the load device 24 to Vss, the load device 24 pulls the RS signal to an active logic 1. The active RS signal activates a redundant memory cell to replace the defective memory cell at the programmed address. Furthermore, when the circuit 22 is programmed, the guard bit fuse FG is blown such that the load device 26 pulls the GB signal to an active logic 1. The active GB signal indicates that the associated circuit 22 is programmed with the address of a defective memory cell.

Thus, as shown, the circuit 22 generates the signal RS independently of the signal GB.

Figure 8B:
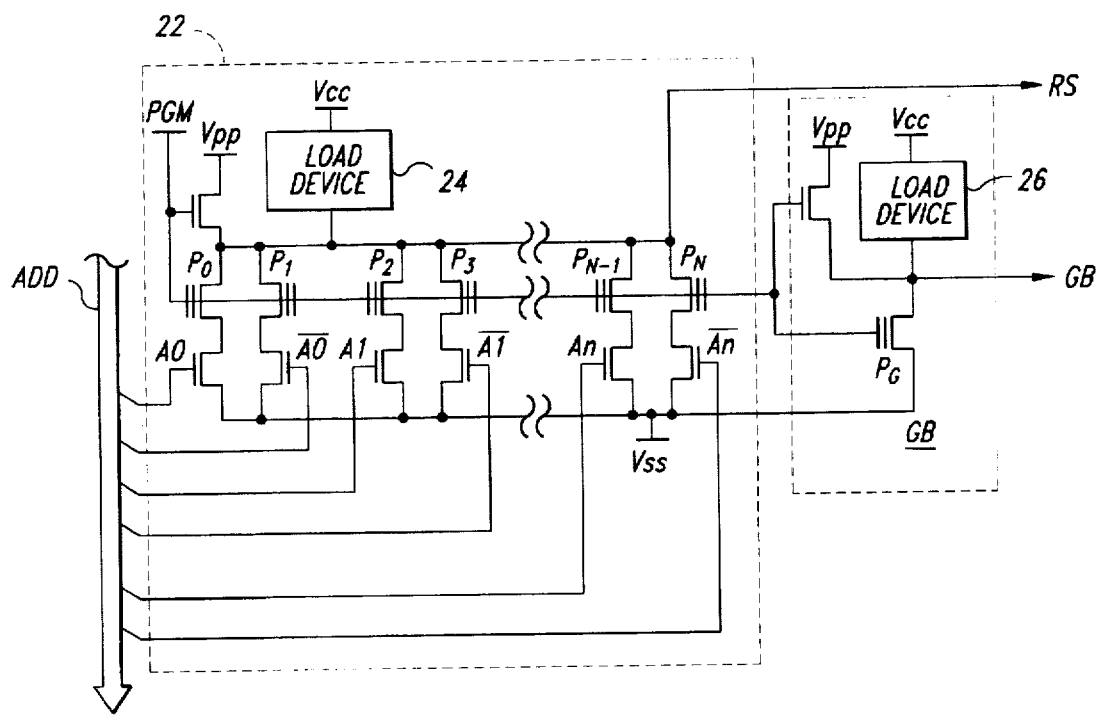
FIG. 8B is a schematic diagram of second embodiments of the nonvolatile-register/redundancy-cell-select circuit and guard bit of FIG. 7.

FIG. 8B is a schematic diagram of another embodiment of the circuits 22 and the GB circuits of FIG. 7. The circuit shown in FIG. 8B is similar to that shown in FIG. 8A, except that in the circuit of FIG. 8B, the fuse elements F of FIG. 8A are replaced with conventional electrically programmable, nonvolatile memory cells P0-PN, and the fuse FG is replaced with a conventional electrically programmable, nonvolatile memory cell PC. The cells P0-PN and PG may also be electrically erasable.

In operation, when the circuit 22 is unprogrammed, all of the memory cells P0-PN are conventionally programmed in a conductive state, such that when the signal line 28 carries a read voltage, which is typically equal to Vcc, one transistor of each transistor pair pulls the RS signal to an inactive logic 0. Furthermore, the cell PG is conventionally programmed in a conductive state such that the signal GB is an inactive logic 0, which indicates that the associated circuit 22 is unprogrammed.

When the circuit 22 is programmed, one of the memory cells P in each transistor pair is programmed in a non-conductive state. The cells P are programmed in a conventional manner using a programming voltage Vpp, which is typically higher than Vcc. When the programmed address occupies the address bus, all of the transistors that are coupled to a conductive one of the memory cells P are nonconductive, and the load device 24 pulls the signal RS to an active logic 1. Furthermore, the memory cell PG is programmed in a non-conductive state, such that the load device 26 pulls the signal GB to an active logic 1, which indicates that the associated circuit 22 is programmed with the address of a defective memory cell.

As discussed above in conjunction with FIG. 8A, the circuit 22 of FIG. 8B generates the signal RS independently of the signal GB. During a check mode when CHKN is active, the circuitry of FIG. 7 couples the signal GB to the output data bus ODBUS such that an external testing device can determine which and how many redundant memory cells the memory device has selected to replace defective matrix memory cells.

It will be appreciated that, although specific embodiments of the invention have been described herein for purposes of illustration, various modifications may be made without departing from the spirit and scope of the invention. Accordingly, the invention is not limited except as by the appended claims.

We claim:

1. Apparatus for identifying redundancy memory cells that are selected to replace defective memory cells of a memory matrix that communicates with a data bus, the apparatus comprising:

a redundancy address register that is associated with one of said redundancy memory cells and that is operable to store a default state until said redundancy address register is programmed with an address of one of said defective memory cells;

a control circuit that is operable to generate a test signal during an identification mode;

a select circuit that is coupled to said control circuit and to said redundancy address register and that is operable to generate a default-detect signal in response to said test signal when said redundancy address register contains said default state; and a data-bus multiplexer that is coupled to said select circuit, said data bus, and said control circuit, said data-bus multiplexer operable to couple said default-detect signal to said data bus in response to said test signal.

2. Apparatus for identifying redundancy memory cells that are selected to replace defective memory cells of a memory matrix that includes at least one memory sector and that communicates with a data bus and an address bus that has a sector address portion, the apparatus comprising:

a first redundancy address register that is associated with a first one of said redundancy memory cells and is operable to store an unprogrammed state until said first redundancy address register is programmed with an address of a first one of said defective memory cells that is located in a first sector of said matrix, said first sector having a first sector address;

a control circuit that is operable to generate a check signal during a check mode;

a first select circuit that is coupled to said control circuit and to said first redundancy address register and that is operable to generate a first unprogrammed-detect signal in response to said check signal when said first redundancy address register contains said unprogrammed state; and a multiplexer circuit that is coupled to said first select circuit, said data bus, and said control circuit, and that is operable to couple said first unprogrammed-detect signal to said data bus in response to said check signal.

3. The apparatus of claim 2, further comprising:

a second redundancy address register that is associated with a second one of said redundancy memory cells and that is operable to store said unprogrammed state until said second redundancy address register is programmed with an address of a second one of said defective memory cells that is located in a second sector of said matrix, said second sector having a second sector address;

a second select circuit that is coupled to said control circuit and to said second redundancy address register and that is operable to generate a second unprogrammed-detect signal in response to said check signal when said second redundancy address register contains said unprogrammed state; and said multiplexer circuit further coupled to said address bus and said second select circuit, said multiplexer circuit further operable to couple said first unprogrammed-detect signal to said data bus when said first sector address occupies said sector portion of said address bus, and to couple said second unprogrammed-detect signal to said data bus when said second sector address occupies said sector portion of said address bus.

4. The apparatus of claim 3 wherein said multiplexer circuit comprises:

a data-bus multiplexer that is coupled to said data bus and said control circuit; and a switch circuit that is coupled to said address bus, said first and second select circuits, and said multiplexer, said switch circuit operable to couple said first unprogrammed-detect signal to said multiplexer when said first sector address occupies said sector portion of said address bus, said switch circuit operable to couple said second unprogrammed-detect signal to said multiplexer when said second sector address occupies said sector portion of said address bus.

5. A method for pointing out redundancy memory cells that are selected to replace defective memory cells of a memory matrix that communicates with a data bus, the method comprising:

storing a default state in a redundancy address register that is associated with one of said redundancy memory cells until said redundancy address register is programmed with an address of one of said defective memory cells;

generating a default-detect signal during a check-number mode if said redundancy address register contains said default state; and coupling said default-detect signal to said data bus during said check-number mode.

6. The method of claim 5, further comprising:

performing said storing, said generating, and said coupling for a plurality of redundancy address registers; and counting a number of default-detect signals that occupy said data bus during said check-number mode.

7. The method of claim 6, further comprising subtracting said number of default-detect signals from a total number of said redundancy memory cells to calculate a number of selected redundancy memory cells.

8. A method for identifying redundancy memory cells that are selected to replace defective memory cells of a memory matrix that includes at least one memory sector and that communicates with a data bus and an address bus that has a sector address portion, the method comprising:

storing in a first redundancy address register that is associated with a first one of said redundancy memory cells an unprogrammed state until said first redundancy address register is programmed with an address of a first one of said defective memory cells that is located in a first sector of said matrix, said first sector having a first sector address;

generating a check signal during a check mode;

generating a first unprogrammed-detect signal in response to said check signal when said first redundancy address register contains said unprogrammed state; and coupling said first unprogrammed-detect signal to said data bus.

9. The method of claim 8, further comprising:

storing in a second redundancy address register that is associated with a second one of said redundancy memory cells said unprogrammed state until said second redundancy address register is programmed with an address of a second one of said defective memory cells that is located in a second sector of said matrix, said second sector having a second sector address;

generating a second unprogrammed-detect signal in response to said check signal when said second redundancy address register contains said unprogrammed state;

coupling said first unprogrammed-detect signal to said data bus when said first sector address occupies said sector portion of said address bus; and coupling said second unprogrammed-detect signal to said data bus when said second sector address occupies said sector portion of said address bus.

10. A memory circuit, comprising:

an address bus;

a data bus;

a memory matrix having at least one sector of memory cells, and having redundancy memory cells that are operable to replace defective ones of said memory cells;

redundancy address registers each associated with one of said redundancy memory cells and each operable to store an unprogrammed state until programmed with an address of one of said defective memory cells;

a control circuit that is operable to generate a check-number signal during a check-number mode of the memory circuit;

a plurality of selection circuits each coupled to said control circuit and to an associated one of said redundancy address registers, each selection circuit operable to generate a redundancy selection signal
  when said check-number signal is present and said unprogrammed state occupies said associated one of said redundancy address registers, and
  when said check-number signal is absent and an address of a defective memory cell that occupies said associated one of said redundancy address registers also occupies said address bus; and a data-bus multiplexer coupled to said control circuit, said data bus, and said selection circuits, said multiplexer operable to couple said redundancy selection signals to said data bus when said check-number signal is present, said multiplexer operable to couple contents of addressed memory and redundancy memory cells to said data bus when said check-number signal is absent.

11. The memory circuit of claim 10, further comprising a redundancy-signal bus that couples said redundancy selection signals from said selection circuits to said redundancy memory cells and to said data-bus multiplexer.

12. The memory circuit of claim 11, further comprising:

said address bus having a cell address portion and a sector address portion; and a switch circuit that is coupled to said memory matrix, to said address bus, and to said redundancy-signal bus, said switch circuit operable to couple said redundancy selection signals that are associated with said redundancy address registers in a first sector of said memory matrix to said redundancy-signal bus when a first-sector address occupies said sector portion of said address bus, said switch circuit operable to couple said redundancy selection signals that are associated with said redundancy address registers in a second sector of said memory matrix to said redundancy-signal bus when a second-sector address occupies said sector portion of said address bus.

13. The memory circuit of claim 10, wherein each of said redundancy address registers comprises:

a programmable, nonvolatile memory element;

a first circuit that is operable to receive a program signal and to program said memory element with a portion of an address of a defective memory cell;

a second circuit that is operable to read said address portion from said memory element; and a third circuit that is operable to compare said address portion from said memory element with a corresponding address portion occupying said address bus and to generate a compare signal if said address portions are equal.

14. The memory circuit of claim 13 wherein said control circuit generates said program signal.

15. The memory circuit of claim 13 wherein each of said selection circuits is operable to receive said compare signal from an associated redundancy address register and to generate therefrom said redundancy selection signal.

16. Apparatus for identifying redundancy memory cells that are programmed to replace defective memory cells of a memory matrix that communicates with a data bus and an address bus, the apparatus comprising:

a control circuit that is operable to generate during a redundancy-check mode a redundancy-check signal having a first state;

a redundancy address register that is associated with a respective one of said redundancy memory cells;

a guard cell that is operable to store an unprogrammed state until said redundancy address register is programmed with an address of one of said defective memory cells; and a data-bus multiplexer that is coupled to said guard storage cell, said data bus, and said control circuit, said data-bus multiplexer operable to couple said guard cell to said data bus in response to said first state of said redundancy-check signal.

17. The apparatus of claim 16 wherein said redundancy address register includes a redundancy-cell selection circuit that is coupled to said guard cell, said associated redundancy memory cell, and said address bus, said redundancy-cell selection circuit operable to generate a redundancy-cell selection signal to enable said associated redundancy memory cell when said redundancy address register is programmed with an address of a defective memory cell, said address occupies said address bus, and said guard cell contains a programmed state.

18. The apparatus of claim 16 wherein said redundancy address register includes a redundancy-cell selection circuit that is coupled to said guard cell, said associated redundancy memory cell, said control circuit, and said address bus, said redundancy-cell selection circuit operable to generate a redundancy-cell selection signal to enable said associated redundancy memory cell when said redundancy address register is programmed with an address of a defective memory cell, said address occupies said address bus, said guard cell contains a programmed state, and said redundancy-check signal has a second state.

19. The apparatus of claim 16, further comprising:

said redundancy address register including a redundancy-cell selection circuit that is coupled to said guard cell, said address bus, and said redundancy circuit, said redundancy-cell selection circuit operable to generate a redundancy-cell selection signal when said redundancy address register is programmed with an address of a defective memory cell, said address occupies said address bus, and said guard cell contains a programmed state; and a redundancy multiplexer that is coupled to said redundancy address register, said data-bus multiplexer, said control circuit, said guard cell, and said associated redundancy memory cell, said redundancy multiplexer operable to couple a contents of said guard cell to said data-bus multiplexer when said redundancy-check signal is in said first state, said redundancy multiplexer operable to couple said redundancy-cell selection signal to said associated redundancy memory cell when said redundancy-check signal is in a second state.

20. The apparatus of claim 16 wherein said guard cell is part of said redundancy address register.

21. The apparatus of claim 16 wherein said redundancy address register includes a redundancy-cell selection circuit that comprises:

first and second power-supply terminals;

a load having a first terminal coupled to said first power-supply terminal and having a second terminal;

a plurality of programmable elements each having a first terminal coupled to said second terminal of said load and having a second terminal;

a plurality of pairs of switches, a first switch of each pair having a control terminal operable to receive a respective address bit from said address bus, said first switch having a switchable path coupled between said second power-supply terminal and said second terminal of a respective one of said programmable elements, a second switch of each pair having a control terminal operable to receive a complement of said address bit and having a switchable path coupled between said second power-supply terminal and said second terminal of another respective one of said programmable elements, said pairs of switches operable to generate a redundancy-cell selection signal on said second terminal of said load when said programmable elements are programmed with said address of said one of said defective memory cells and said switches receive said address.

22. The apparatus of claim 21 wherein each of said programmable elements comprises a respective fuse.

23. The apparatus of claim 21 wherein each of said programmable elements comprises a respective nonvolatile memory cell.

24. The apparatus of claim 16, wherein said guard cell comprises:

first and second power-supply terminals;

a load having a first terminal coupled to said first power-supply terminal and having a second terminal; and a programmable element coupled between said second terminal of said load and said second power-supply terminal, said programmable element operable to be programmed in a nonconductive state when said redundancy address register is programmed with said address of said one of said defective memory cells.

25. The apparatus of claim 24, wherein said programmable element comprises a fuse.

26. The apparatus of claim 24, wherein said programmable element comprises a nonvolatile memory cell.

27. A method for identifying redundancy memory cells that are programmed to replace defective memory cells of a memory matrix that communicates with a data bus and an address bus, the method comprising:

storing an unprogrammed state in a guard register that is associated with a redundancy address register until said redundancy address register is programmed with an address of one of said defective memory cells, said redundancy address register being associated with a respective one of said redundancy memory cells; and coupling contents of said guard register to said data bus during a guard-register check mode.

28. The method of claim 27, further comprising generating a redundancy-cell selection signal to enable said respective redundancy memory cell when said redundancy address register is programmed with said address of said defective memory cell and said address occupies said address bus.

29. The method of claim 27, further comprising generating a redundancy-cell selection signal to enable said associated redundancy memory cell when said redundancy address register is programmed with said address of said defective memory cell, said address occupies said address bus, and said guard register contains a programmed state.

30. The method of claim 27, further comprising:

generating a redundancy-cell selection signal when said redundancy address register is programmed with said address of said defective memory cell and said address occupies said address bus; and coupling said redundancy-cell selection signal to said respective redundancy memory cell during an operational mode.

31. A memory device, comprising:

an address bus having one or more address bits;

a data bus;

a memory matrix having at least one sector of memory cells, and having redundancy memory cells that are operable to replace defective ones of said memory cells;

a control circuit that is operable to generate a check-number signal having a first value during a check-number mode of said memory device;

redundancy address registers that are coupled to said address bus and that are each associated with one of said redundancy memory cells;

a plurality of guard cells that are each associated with one of said redundant address registers, that each store an unprogrammed state before said associated redundancy address register is programmed with an address of one of said defective memory cells, and that each store a programmed state after said associated redundancy address register is programmed with said address; and a data-bus multiplexer that is coupled to said guard cells, said data bus, and said control circuit, said data-bus multiplexer operable to couple said guard cells to said data bus in response to said first value of said check-number signal.

32. The apparatus of claim 31, further comprising:

said check-number circuit operable to generate said check-number signal having a second value during an operational mode of said memory circuit;

said each redundancy address register including a redundancy-cell selection circuit that is coupled to said associated guard cell and said address bus, said redundancy-cell selection circuit operable to generate a redundancy-cell selection signal when said each redundancy address register is programmed with an address of a defective memory cell, said address occupies said address bus, and said associated guard cell contains a programmed state; and redundancy multiplexers that are each coupled to one of said redundancy address registers, said data-bus multiplexer, said control circuit, said associated guard cell, and said associated redundancy memory cell, each said redundancy multiplexer operable to couple to said data-bus multiplexer a contents of said associated guard cell when said check-number signal has said first value, each said redundancy multiplexer operable to couple said redundancy-cell selection signal to said associated redundancy memory cell when said check-number signal has said second value.

33. The memory circuit of claim 32, further comprising a redundancy bus that is coupled to and allows communication among said redundancy multiplexers, said redundancy memory cells, and said data-bus multiplexer.

34. The memory device of claim 31, wherein said redundancy address registers each include a redundancy-cell selection circuit that comprises:

first and second power-supply terminals;

a load having a first terminal coupled to said first power-supply terminal and having a second terminal;

a plurality of programmable elements each having a first terminal coupled to said second terminal of said load and having a second terminal;

a plurality of pairs of parallel coupled switches, a first switch of each pair having a control terminal coupled to a respective one of said address bits and having a switchable path coupled between said second power-supply terminal and said second terminal of a respective one of said programmable elements, a second switch of each pair having a control terminal operable coupled to a complement of said respective address bit and having a switchable path coupled between said second power-supply terminal and said second terminal of a respective other one of said programmable elements, said redundancy-cell selection circuit operable to generate a redundancy-cell selection signal on said second terminal of said load when said programmable elements are programmed with said address of said one of said defective memory cells and said address occupies said address bus.

35. The memory apparatus of claim 31, wherein each of said guard cells comprises:

first and second power-supply terminals;

a load having a first terminal coupled to said first power-supply terminal and having a second terminal that is coupled to said data-bus multiplexer; and a programmable element coupled between said second terminal of said load and said second power-supply terminal.

* * * * *